US012566205B2

(12) United States Patent
Redaelli

(10) Patent No.: US 12,566,205 B2
(45) Date of Patent: Mar. 3, 2026

(54) CAPACITOR TEST

(71) Applicant: Micron Technology, Inc., Boise, ID (US)

(72) Inventor: Marco Redaelli, Munich (DE)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 18/587,128

(22) Filed: Feb. 26, 2024

(65) Prior Publication Data

US 2024/0288480 A1 Aug. 29, 2024

Related U.S. Application Data

(60) Provisional application No. 63/487,442, filed on Feb. 28, 2023.

(51) Int. Cl.
*G01R 27/26* (2006.01)
*G01R 31/01* (2020.01)

(52) U.S. Cl.
CPC ....... *G01R 31/016* (2013.01); *G01R 27/2688* (2013.01)

(58) Field of Classification Search
CPC .................................................. G01R 27/2688
See application file for complete search history.

(56) References Cited

U.S. PATENT DOCUMENTS

| | | | | |
|---|---|---|---|---|
| 5,880,589 | A | * 3/1999 | Okano ................ | B60R 21/0173 |
| | | | | 340/653 |
| 2015/0198647 | A1 | * 7/2015 | Atwood ............. | G01R 31/2884 |
| | | | | 324/548 |
| 2017/0069356 | A1 | * 3/2017 | Schmidt ................. | G11C 29/02 |
| 2019/0079125 | A1 | * 3/2019 | Abrahams .............. | G11C 5/141 |

* cited by examiner

*Primary Examiner* — Thang X Le
(74) *Attorney, Agent, or Firm* — Harrity & Harrity, LLP

(57) ABSTRACT

Implementations described herein relate to a capacitor test. In some implementations, a system may include a memory device, one or more capacitors located externally to the memory device, and one or more components configured to initiate a capacitor test for the one or more capacitors. The one or more components may be configured to perform an iteration of the capacitor test for the one or more capacitors, wherein performing the iteration of the capacitor test comprises waiting a time period, increasing a discharge time, reading a counter associated with the capacitor test, and determining whether a value of the counter has increased. The one or more components may be configured to perform another iteration of the capacitor test or terminate the capacitor test based on determining whether the value of the counter has increased.

20 Claims, 6 Drawing Sheets

200

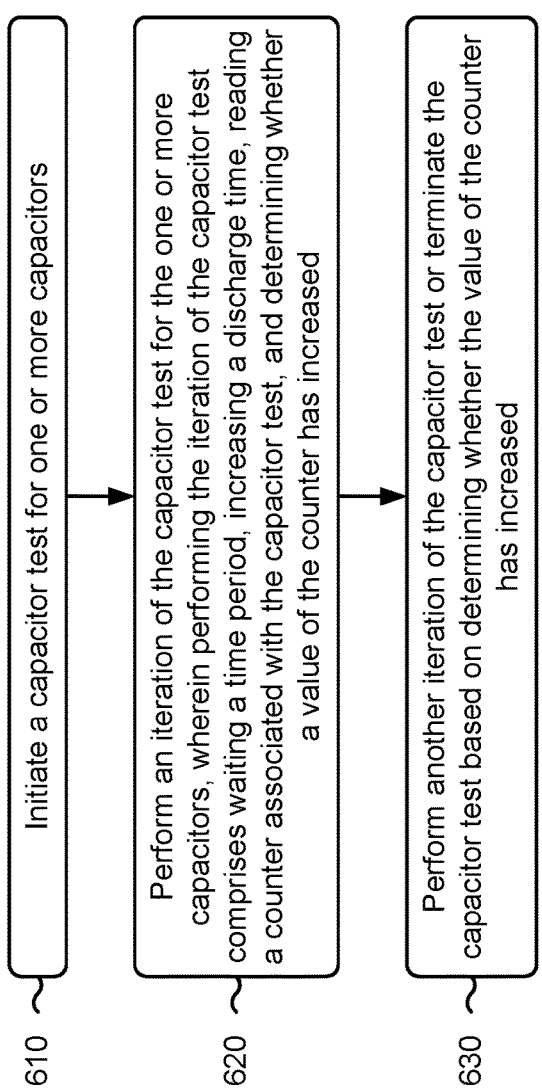

610 Initiate a capacitor test for one or more capacitors

620 Perform an iteration of the capacitor test for the one or more capacitors, wherein performing the iteration of the capacitor test comprises waiting a time period, increasing a discharge time, reading a counter associated with the capacitor test, and determining whether a value of the counter has increased 630 Perform another iteration of the capacitor test or terminate the capacitor test based on determining whether the value of the counter has increased

CAPACITOR TEST

CROSS-REFERENCE TO RELATED APPLICATION

This Patent Application claims priority to U.S. Provisional Patent Application No. 63/487,442, filed on Feb. 28, 2023, and entitled "CAPACITOR TEST." The disclosure of the prior Application is considered part of and is incorporated by reference into this Patent Application.

TECHNICAL FIELD

The present disclosure generally relates to memory devices, memory device operations, and, for example, to a capacitor test.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

BRIEF DESCRIPTION OF THE DRAWINGS

FIG. 6 is a flowchart of an example method associated with capacitor test.

DETAILED DESCRIPTION

Figure 1:
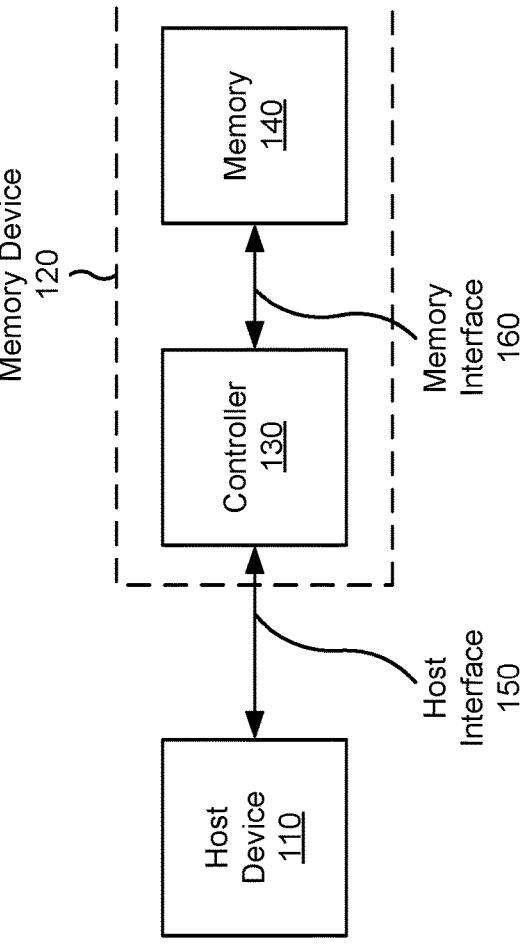
FIG. 1 is a diagram illustrating an example system capable of capacitor testing.

A capacitor is an electrical component that includes two conducting substances, such as metal plates, separated by a non-conducting substance, such as a dielectric. The capacitor may store energy from a battery while the capacitor is connected to the battery. When the capacitor is disconnected from the battery, current may flow from one metal plate to the other metal plate, which may provide power to a device, such as a memory device that is connected to the capacitor, until the energy stored by the capacitor is completely discharged. A first type of memory device, such as such a non-volatile memory (NVM) module or an enterprise solid-state drive (SSD), may have one or more internal capacitors that provide backup power for the memory device. When the first type of memory experiences a power loss, such as an emergency system power down or abrupt power loss (APL), the internal capacitors may provide backup power that enables the first type of memory device to store data and/or metadata in the memory of the memory device prior to the memory device being powered down. A second type of memory device, such as a ball grid array (BGA) memory device, may not have internal capacitors that provide backup power for the memory device. For example, the BGA device may be smaller than the enterprise SSD, which may enable the BGA device to have increased mechanical robustness compared to the enterprise SSD, but may also result in the BGA device being too small to include the capacitors that provide the power backup. In this case, the capacitors may be located externally to the BGA device. For example, the BGA device and the capacitors may be located on a customer board and may be connected by one or more other electrical components. The capacitors may provide power to the BGA device via the one or more other electrical components in the event of a power loss.

In some applications, such as automotive applications and embedded applications, capacitors that provide backup power to a memory device may need to be guaranteed to be functional for a product lifetime, such as ten years or fifteen years. To ensure that the capacitors are functional for the product lifetime, the capacitors may be periodically tested using a capacitor test. In a case where the capacitors are included within the memory device, such as for the enterprise SSD, the capacitor test may be performed by the memory device itself (e.g., by a controller of the memory device). However, in a case where the capacitors are located externally to the memory device, such as for the BGA device, the memory device may not be configured to perform the capacitor test. Thus, it may not be possible for the memory device to guarantee the power backup capacitors for the product lifetime.

Some implementations describe herein enable a capacitor test. Specifically, the implementations described herein may enable a capacitor test for one or more capacitors that are located externally to a memory device, such as a BGA device. In some implementations, a system may include the memory device and one or more capacitors that are located externally to the memory device. The system may include one or more components that are configured to perform a capacitor test for the one or more capacitors. The one or more components, to perform the capacitor test for the one or more capacitors, may be configured to wait a time period (such as one second), increase a discharge time for the one or more capacitors, read a counter, and determine whether a value associated with the counter has increased. In some implementations, the counter may be a voltage detector (VDT) self-monitoring, analysis, and reporting technology (SMART) counter, and the value of the counter may increase based on a voltage associated with the memory device falling below a voltage threshold. If the value associated with the counter has not increased, the one or more components may be configured to continue the capacitor test (e.g., by performing another iteration of waiting the time period, increasing the discharge time, reading the counter, and determining whether the value of the counter has increased). If the value associated with the counter has increased, the one or more components may be configured to terminate the capacitor test and to generate an output that includes the discharge time for the one or more capacitors. The discharge time may correspond to the number of iterations of the capacitor test that were performed. For example, the discharge time that is output by the one or more components may be increased by one second each time that one or more components determine that the VDT SMART counter has not increased. The discharge time may be used to determine whether the one or more capacitors need to be replaced and/or whether the capacitors can be guaranteed for the product lifetime.

The implementations described herein may enable the capacitor test to be performed with few or no changes to board schematics and with little or no increase to the system cost. The capacitor test may be performed without manual intervention (e.g., without removing the memory device and the capacitors from the board). The capacitor test may result in less noise being injected into the low voltage components of the system (e.g., system-on-chip (SOC), dynamic RAM (DRAM), SSD, managed NAND (mNAND), and/or NOR devices, among other examples), since the capacitor test circuitry can be placed closer to higher voltage (e.g., 12 V) components and further from lower voltage (e.g., 3 V or 5 V) components. Thus, a health status of the one or more capacitors can be checked and guaranteed without significant changes to the board schematics, without removing the memory device and the capacitors from the board, and without injecting noise into the low voltage system components. Additional details are described herein.

FIG. 1 is a diagram illustrating an example system 100 capable of capacitor test. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe)

device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include control logic, a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, one or more systems, devices, apparatuses, components, and/or controllers of FIG. 1 may be configured to initiate a capacitor test for one or more capacitors located externally to the memory device; perform an iteration of the capacitor test for the one or more capacitors, wherein performing the iteration of the capacitor test comprises: wait a time period; increase a discharge time; read a counter associated with the capacitor test; and determine whether a value of the counter has increased; and perform another iteration of the capacitor test or terminate the capacitor test based on determining whether the value of the counter has increased.

In some implementations, one or more systems, devices, apparatuses, components, and/or controllers of FIG. 1 may be configured to initiate a capacitor test for one or more capacitors; perform an iteration of the capacitor test for the one or more capacitors, wherein performing the iteration of the capacitor test comprises: wait a time period; increase a discharge time; read a counter associated with the capacitor test; and determine whether a value of the counter has increased; and perform another iteration of the capacitor test or terminate the capacitor test based on determining whether the value of the counter has increased.

In some implementations, one or more systems, devices, apparatuses, components, and/or controllers of FIG. 1 may be configured initiate a capacitor test for one or more capacitors while the memory device is connected to the system; perform an iteration of the capacitor test for the one or more capacitors, wherein performing the iteration of the capacitor test comprises: wait a time period; increase a discharge time; read a counter associated with the capacitor test; and determine whether a value of the counter has increased; and perform another iteration of the capacitor test or terminate the capacitor test based on determining whether the value of the counter has increased.

As indicated above, FIG. 1 is provided as an example. Other examples may differ from what is described with regard to FIG. 1.

Figure 2:
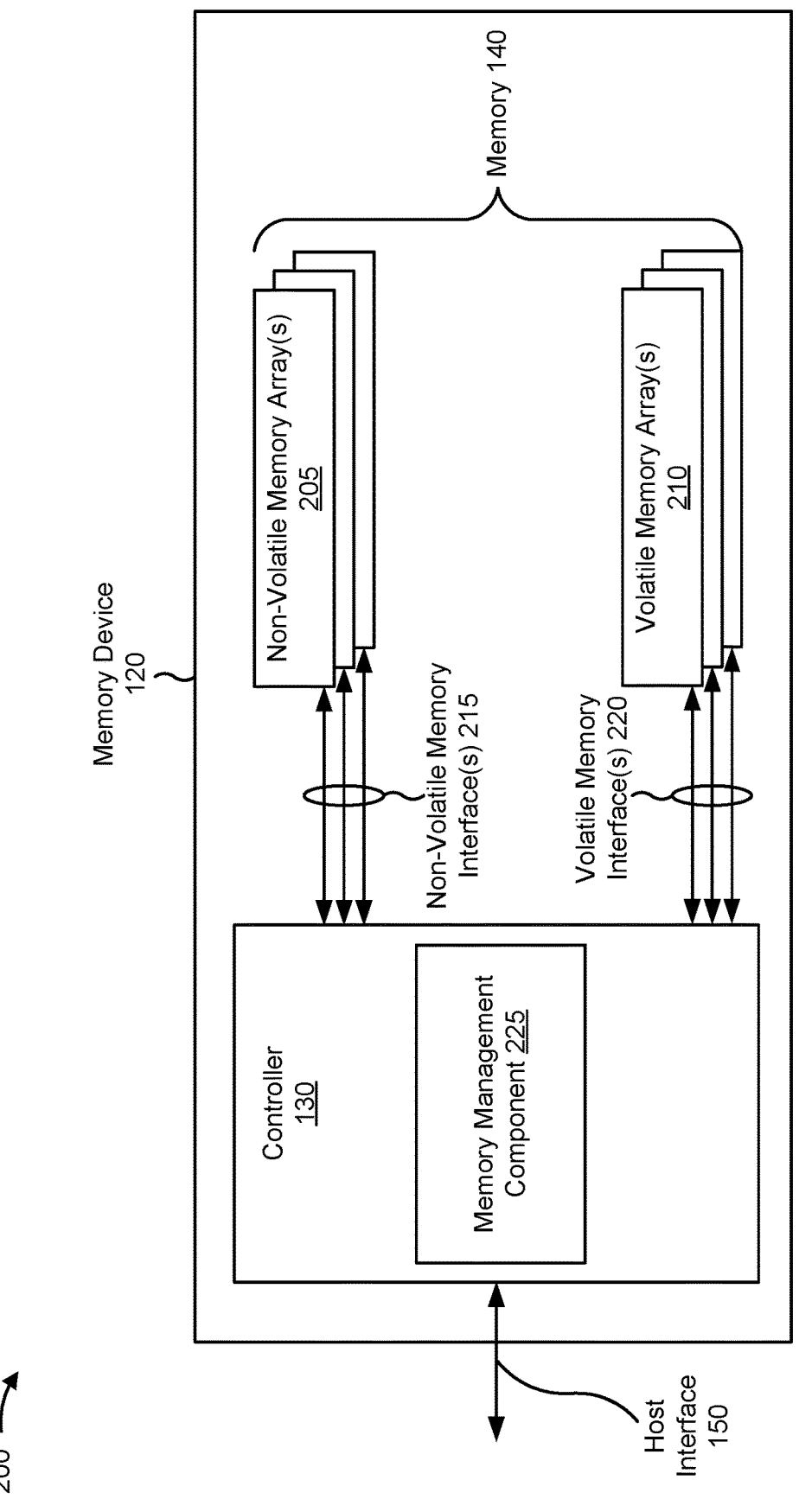
FIG. 2 is a diagram of example components included in a memory device.

FIG. 2 is a diagram of example components 200 included in a memory device 120. In some implementations, the memory device 120 may be a BGA device. As described above in connection with FIG. 1, the memory device 120 may include a controller 130 and memory 140. As shown in FIG. 2, the memory 140 may include one or more non-volatile memory arrays 205, such as one or more NAND memory arrays and/or one or more NOR memory arrays. Additionally, or alternatively, the memory 140 may include one or more volatile memory arrays 210, such as one or more SRAM arrays and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 225. In some implementations, one or more of these components are implemented as one or more instructions (e.g., firmware) executed by the controller 130. Alternatively, one or more of these components may be implemented as dedicated integrated circuits distinct from the controller 130.

The memory management component 225 may be configured to manage performance of the memory device 120. For example, the memory management component 225 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 225, such as information regarding memory block age, memory block erase count, and/or error information associated with a memory partition (e.g., a memory cell, a row of memory, a block of memory, or the like).

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
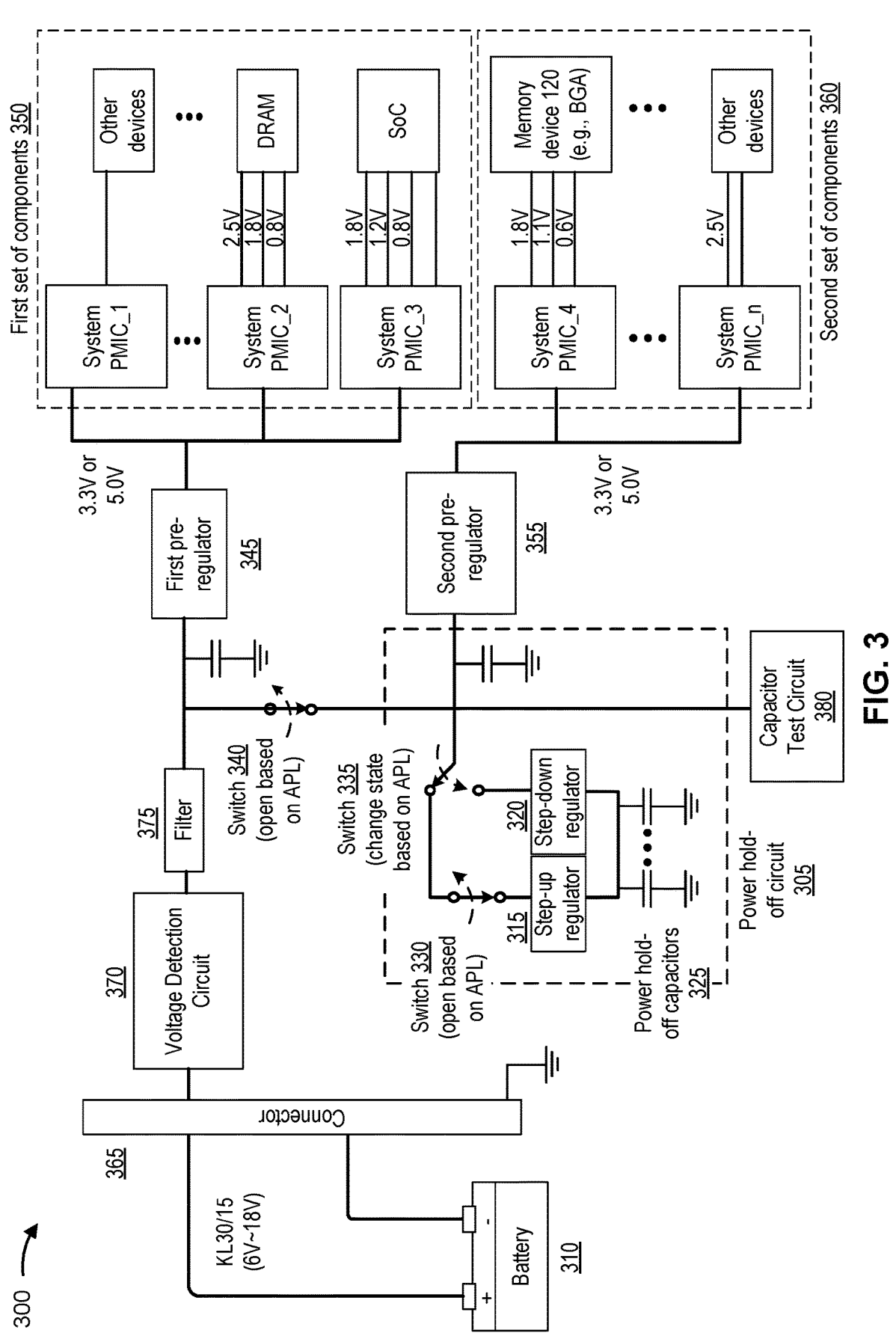
FIG. 3 is a diagram illustrating an example system that includes a power hold-off circuit and a capacitor test circuit.

FIG. 3 is a diagram illustrating an example system 300 that includes a power hold-off circuit and a capacitor test circuit. The system 300 may include the power hold-off circuit 305 and a battery 310. The power hold-off circuit 305 may include a step-up regulator 315, a step-down regulator 320, and one or more power hold-off capacitors 325. The step-up regulator 315 may be configured to receive an input voltage and to output an output voltage that is higher than the input voltage. The step-up regulator 315 may enable the power hold-off capacitors 325 to be charged at a higher voltage (such as 12 V, 18 V, or 35 V, among other examples). The step-down regulator 320 may be configured to receive an input voltage and to output an output voltage that is lower than the input voltage. The step-down regulator 320 may enable system components or devices that require a power backup for emergency data storing to be charged by the power hold-off capacitors 325 at a lower voltage (such as 3.3 V or 5 V). The power hold-off capacitors 325 may be configured to charge one or more system components or devices when a voltage from the battery falls below a voltage threshold and/or based on an occurrence of an APL event. The APL event may occur, for example, when the battery 310 becomes disconnected from the system 300. The power hold-off circuit 305 may include a first switch 330 and a second switch 335. The first switch 330 may be in a closed state when the voltage from the battery satisfies the voltage threshold and may be in an open state when the voltage from the battery does not satisfy the voltage threshold. The second switch 335 may be connected to the step-up regulator 315 when the voltage from the battery satisfies the voltage threshold and may be connected to the step-down regulator 320 when the voltage from the battery does not satisfy the voltage threshold.

In some implementations, the system 300 may include a third switch 340. The third switch 340 may be in a closed state when the voltage from the battery satisfies the voltage threshold and may be in an open state when the voltage from the battery does not satisfy the voltage threshold. The third switch 340 may be located in a path that is between the power hold-off circuit 305 and the battery 310. The system 300 may include one or more pre-regulators. A first pre-regulator 345 may be located in a path that is between the battery 310 and a first set of components 350. The first set of components 350 may include devices that do not require a power backup and/or may include devices that do not need to perform emergency data storing prior to a power loss. For example, the first set of components 350 may include a DRAM or a system-on-chip (SOC) device. A second pre-regulator 355 may be located in a path that is between the battery 310 and a second set of components 360. The second set of components 360 may include devices that require a power backup in the event of a power loss. For example, the second set of components may include a BGA device.

In some implementations, the system 300 may include a connector 365. The connector 365 may be connected to the battery 310 and may be connected to a ground. The system 300 may include a voltage detection circuit 370. The voltage detection circuit 370 may be, for example, a reverse under-voltage over-voltage protection circuit. The voltage detection circuit 370 may be configured to detect whether the voltage from the battery satisfies the voltage threshold. For example, the voltage detection circuit 370 may detect that the voltage from the battery satisfies the voltage threshold based on the voltage from the battery being greater than, or greater than or equal to, the voltage threshold, or may detect that the voltage from the battery does not satisfy the voltage threshold based on the voltage from the battery being less than, or less than or equal to, the voltage threshold. The system 300 may include a filter 375. The filter 375 may be, for example, a low-pass filter, a high-pass filter, a band-pass filter, or a notch filter, among other examples.

In some implementations, the battery 310 may be in a connected state. When the battery 310 is in the connected state, the third switch 340 may be in the closed state, the first switch 330 may be in the closed state, and the second switch 335 may be connected to the step-up regulator 315. The voltage from the battery 310 may satisfy the voltage threshold. For example, the voltage from the battery 310 may be 6 V, 12 V, or 18 V. When the battery 310 is in the connected state, current may flow from the battery 310 to the connector 365, from the connector 365 to the voltage detection circuit 370, and from the voltage detection circuit 370 to the filter 375.

In some implementations, current may flow from the filter 375 to the first pre-regulator 345. For example, current may flow from the filter 375 to a capacitor, from the capacitor to the first pre-regulator 345, and from the first pre-regulator 345 to the first set of components 350. The first pre-regulator 345 may perform voltage regulation and may have an output voltage that is equal to 3.3 V or 5 V. The first set of components 350 may include one or more power management integrated circuits (PMICs), such as PMIC_1, PMIC_2, and PMIC_3. The first set of components 350 may include one or more devices that do not require a power backup based on the occurrence of the APL event. For example, the PMIC_2 may be connected to a DRAM, and the PMIC_3 may be connected to an SOC device.

In some implementations, current may flow from the filter 375 to the second pre-regulator 355. For example, current may flow from the filter 375 to the third switch 340, from the third switch 340 to a capacitor, from the capacitor to the second pre-regulator 355, and from the second pre-regulator 355 to the second set of components 360. The second pre-regulator 355 may perform voltage regulation and may have an output voltage that is equal to 3.3 V or 5 V. The second set of components 360 may include one or more PMICs, such as PMIC_4, and PMIC_n. Each of the PMICs may have an input voltage of 3.3 V or 5 V based on the output of the second pre-regulator 355. The second set of components 350 may include one or more devices that require a power backup based on the occurrence of the APL event. For example, the PMIC_4 may be connected to an SSD.

In some implementations, current may flow from the filter 375 to the power hold-off circuit 305. For example, current may flow from the filter 375 to the third switch 340, and from the third switch 340 to an input of the power hold-off circuit 305. Additionally, current may flow from the input of the power hold-off circuit 305 to the first switch 330, from the first switch 330 to the step-up regulator 315, and from the step-up regulator 315 to the one or more power hold-off capacitors 325. This may enable the one or more power hold-off capacitors 325 to be charged by the step-up regulator 315 using power from the battery 310 at the higher voltage (such as 12 V, 18 V, or 35 V) when the battery 310 is in the connected state.

In some implementations, the system 300 may experience an APL event. The APL event may occur, for example, when the voltage from the battery 310 falls below the voltage threshold, such as when the battery 310 becomes disconnected from the system 300. In some implementations, the voltage detection circuit 370 (such as the reverse under-voltage over-voltage protection circuit) may detect that the voltage from the battery satisfies the voltage threshold based on the voltage from the battery being greater than, or greater than or equal to, the voltage threshold, or may detect that the voltage from the battery does not satisfy the voltage threshold based on the voltage from the battery being less than, or less than or equal to, the voltage threshold. In some implementations, the voltage threshold may be a voltage that is between 5 V and 6 V. For example, the voltage from the battery 310 may drop below a voltage threshold of 5.5 V based on the battery 310 becoming disconnected from the system 300.

When the APL event is detected, the third switch 340 may change from the closed state to the open state, the first switch 330 may change from the closed state to the open state, and the second switch 335 may change from being connected to the step-up regulator 315 to being connected to the step-down regulator 320. When the third switch 340 is in the open state, the first switch 330 is in the open state, and the second switch 335 is connected to the step-down regulator 320, the power hold-off capacitors 325 may discharge power to the second set of components 360. For example, current may flow from the power hold-off capacitors 325 to the step-down regulator 320, from the step-down regulator 320 to the second switch 335, from the second switch 335 to a capacitor, and from the capacitor to the second pre-regulator 355. This may allow the second set of components 360, such as the BGA device, to perform an emergency data storing operation prior to experiencing a power loss. The power hold-off capacitors 325 may be configured to discharge power for a time period (such as 5 ms to 25 ms) that is long enough to allow the second set of components 360 to perform the emergency data storing operation prior to experiencing the power loss. When the third switch 340 is in the open state, the first switch 330 is in the open state, and the second switch 335 is connected to the step-down regulator 320, the power hold-off capacitors 325 may not provide power to the first set of components 350.

In some implementations, the system 300 may include a capacitor test circuit 380. The capacitor test circuit 380 may be configured to test one or more capacitors of the system 300. For example, the capacitor test circuit 380 may be configured to test one or more of the power hold-off capacitors 325. In some other implementations, the capacitor test circuit 380 may be included in a different system and/or may be configured to test one or more other capacitors not shown in FIG. 3. Additional details are described herein.

As indicated above, FIG. 3 is provided as an example. Other examples may differ from what is described with regard to FIG. 3.

Figure 4:
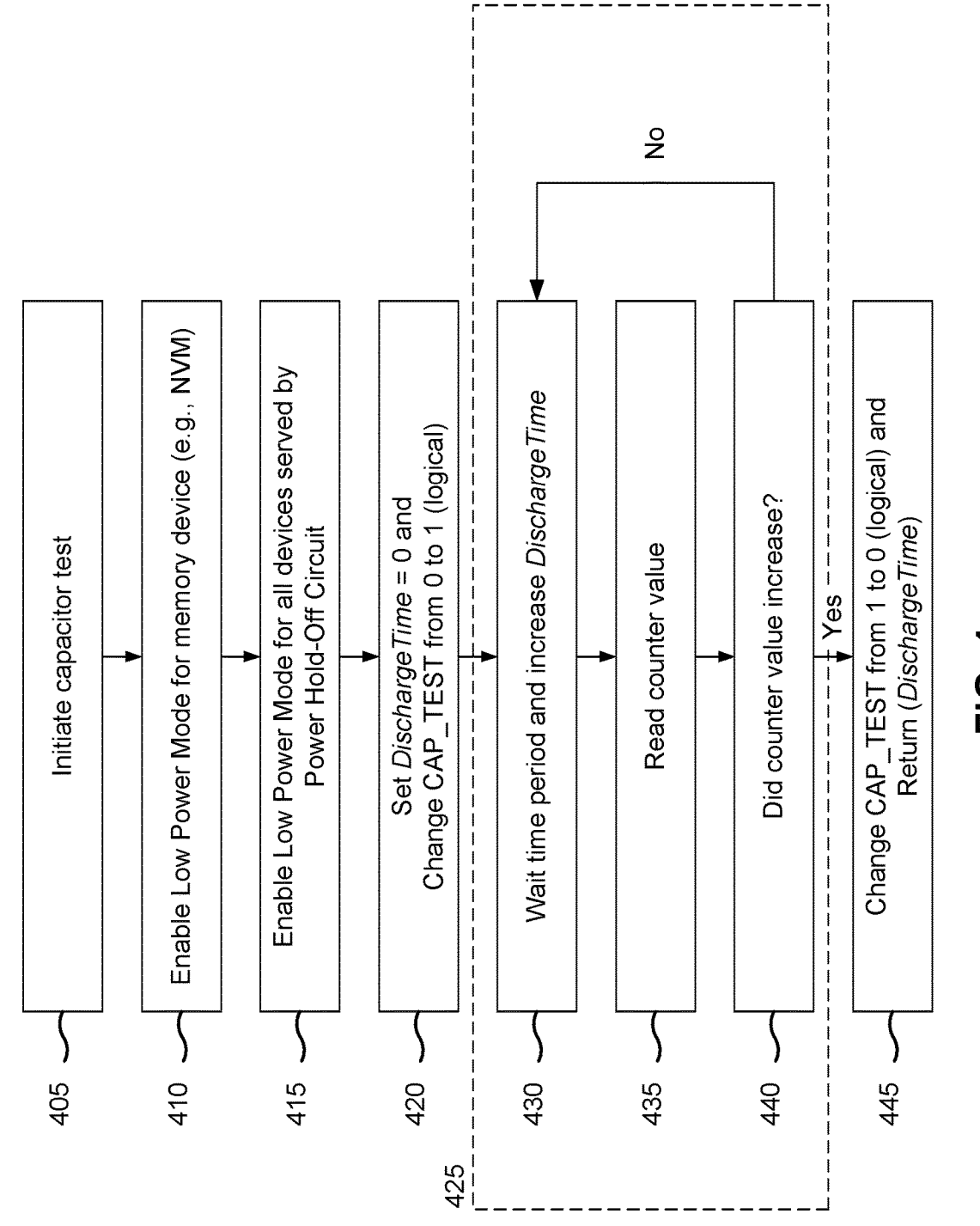
FIG. 4 is a diagram illustrating an example of a capacitor test.

FIG. 4 is a diagram illustrating an example 400 of a capacitor test. As shown by reference number 405, the host device 110 may initiate a capacitor test. In some implementations, the host device 110 may be an SOC device, such as the SOC included in the first set of components 350. The capacitor test may be configured to test one or more capacitors. For example, the capacitor test may be configured to test a discharge capability of the power hold-off capacitors 325. In some implementations, the capacitor test may be performed by a capacitor test circuit. For example, the host device 110 may instruct the capacitor test circuit 380 to perform a capacitor test for the power hold-off capacitors 325.

As shown by reference number 410, the host device 110 may enable a low power mode for the memory device 120. For example, the SOC device and/or a safety microcontroller unit (MCU) may enable the low power mode for a BGA device.

As shown by reference number 415, the host device 110 may enable a low power mode for all devices served by the power hold-off circuit 305. For example, the SOC device and/or the safety MCU may enable the lower power mode for all devices served by the power hold-off circuit 305.

As shown by reference number 420, the host device 110 may set a discharge time indicator (DischargeTime) for the one or more capacitors to zero. Additionally, the host device

110 may change a capacitor test indicator (e.g., CAP_TEST) from a logic low value (0) to a logic high value (1). In some implementations, the capacitor test indicator may be a capacitor test bit. For example, the host device 110 may transmit a signal that causes the capacitor test bit to change from the logic low value to the logic high value, which may result in the capacitor test being initiated. Changing the capacitor test indicator may cause one or more hardware switches to change states. For example, changing the capacitor test bit from the logic low value to the logic high value may cause the third switch 340 to change from the closed state to the open state, the first switch 330 to change from the closed state to the open state, and the second switch 335 to change from being connected to the step-up regulator 315 to being connected to the step-down regulator 320. At this point, the one or more capacitors may begin discharging (e.g., to the second set of components 360).

As shown by reference number 425, the host device 110 and/or the capacitor test circuit 380 may perform the capacitor test. In some implementations, the capacitor test may include one or more of the steps described below in connection with reference numbers 430, 435, and 440. In some other implementations, the capacitor test may include a subset of the steps performed in connection with reference numbers 430, 435, and 440, and/or may include other steps. At each of the steps, the voltage level of the capacitor under test may be checked until the capacitor voltage reaches a minimum voltage level.

As shown by reference number 430, the host device 110 and/or the capacitor test circuit 380 may wait a time period. In some implementations, the time period may be one second. For example, host device 110 and/or the capacitor test circuit 380 may initiate the capacitor test (e.g., as described in connection with reference number 425) and may wait one second prior to performing the next step (e.g., reading a counter, as described below in connection with reference number 435). Additionally, the host device 110 and/or the capacitor test circuit 380 may increase a discharge time for the one or more capacitors. For example, the discharge time may be increased from 0 to 1 second.

As shown by reference number 435, the host device 110 and/or the capacitor test circuit 380 may read a counter. The counter may be a counter that is associated with the memory device 120. The memory device 120 may increase a value of the counter (e.g., by one) each time that the memory device 120 detects a low voltage condition for the memory device 120. In some implementations, reading the counter may include reading a VDT SMART counter. The memory device 120 may maintain a constant power while connected to the battery based on receiving a constant current and based on a constant voltage. After being disconnected from the battery, the voltage (and/or power) of the memory device 120 may begin to decrease (e.g., under the constant current). The memory device 120 may increase the value of the VDT SMART counter each time that the memory device voltage falls below a voltage threshold (VDT). In some implementations, the capacitor test may be configured with multiple voltage thresholds. For example, a first voltage threshold (VDT1) may be associated with a smaller voltage drop and a second voltage threshold (VDT2) may be associated with a larger voltage drop. Additional details are described in connection with FIG. 5.

As shown by reference number 440, the host device 110 and/or the capacitor test circuit 380 may determine whether the counter has increased. In some implementations, the counter may not reset each time that the counter is used. Thus, determining whether the counter has increased may include detecting that the counter has increased by 1 from any value (e.g., from 0 to 1, from 3 to 4, or from 8 to 9, among other examples). If the counter value has increased, the host device 110 and/or the capacitor test circuit 380 may terminate (e.g., stop performing) the capacitor test, and may proceed to the step associated with reference number 445. If the counter value has not increased, the host device 110 and/or the capacitor test circuit 380 may continue the capacitor test (e.g., by performing another iteration of the capacitor test 425). For example, the host device 110 and/or the capacitor test circuit 380 may wait one more second, increase the discharge time by one second, read the counter value, and determine whether the counter value has increased. The host device 110 and/or the capacitor test circuit 380 may perform any number of iterations of the capacitor test until the counter value increases.

As shown by reference number 445, the host device 110 may change the capacitor test indicator from logic high to logic low. For example, the host device 110 may transmit a signal that causes the capacitor test bit to change from the logic high value to the logic low value, which may result in the capacitor test being terminated. Additionally, the host device 110 may generate an output that includes the discharge time. In some implementations, the discharge time may be equal to the number of iterations of the capacitor test 425. For example, if six iterations of the capacitor test 425 were performed by the host device 110 and/or the capacitor test circuit 380, the discharge time may be equal to six (e.g., six seconds). In some implementations, the discharge time for the one or more capacitors may be measured using an analog-to-digital converter (ADC). In one example, an ADC may be added to the system for measuring the discharge time of the one or more capacitors. In another example, an ADC converter associated with the SOC may be used for measuring the discharge time of the one or more capacitors.

In some implementations, the discharge time may be used to determine whether the one or more capacitors need to be replaced (e.g., by indicating whether the one or more capacitors can be guaranteed for the product lifetime). For example, if the discharge time of a capacitor satisfies a discharge time threshold, the capacitor may be considered to be functional and does not need to be replaced. Alternatively, if the discharge time of the capacitor does not satisfy the discharge time threshold, the capacitor may need to be replaced.

The implementations described herein may enable the capacitor test to be performed with few or no changes to board schematics and with little or no increase to the system cost. The capacitor test may be performed without manual intervention (e.g., without removing the memory device and the capacitors from the board). The capacitor test may result in less noise being injected into the low voltage components of the system (e.g., the SOC, DRAM, SSD, mNAND, and/or NOR devices, among other examples), since the capacitor test circuitry can be placed closer to the higher voltage (e.g., 12 V) components and further from the lower voltage (e.g., 3 V or 5 V) components. Thus, a functionality of the one or more capacitors can be checked and guaranteed without significant changes to the board schematics, without removing the memory device and the capacitors from the board, and without injecting noise into the low voltage system components. Additionally, the capacitor test may be performed by leveraging the SSD hardware resources (e.g., VDT SMART) and without using additional system resources.

As indicated above, FIG. 4 is provided as an example. Other examples may differ from what is described with regard to FIG. 4.

Figure 5:
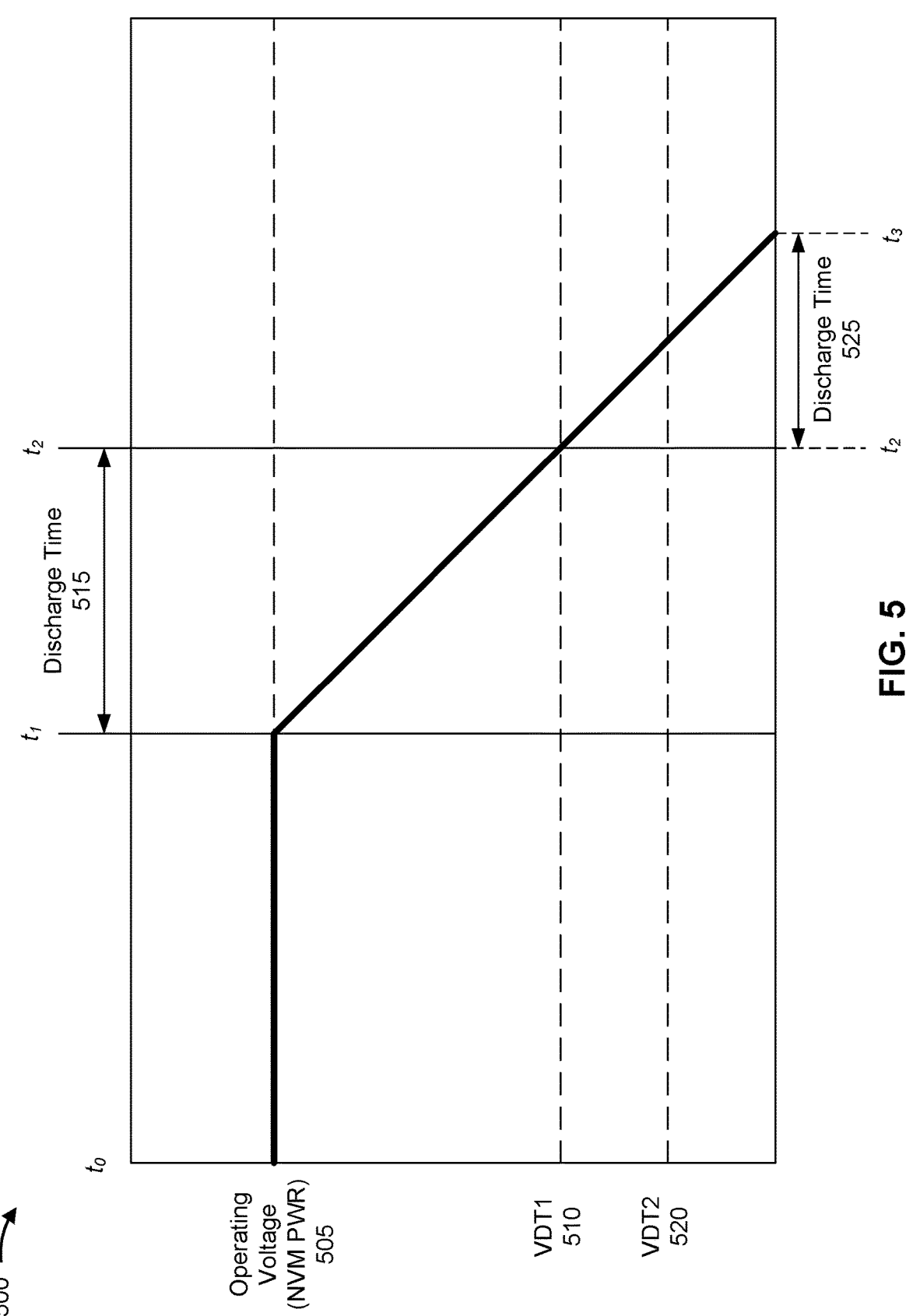
FIG. 5 is a diagram illustrating an example of a discharge time for a capacitor test.

FIG. 5 is a diagram illustrating an example 500 of a discharge time for a capacitor test. As described herein, the host device 110 may initiate a capacitor test for one or more capacitors, enable a low power mode for the memory device and for all devices served by the power hold-off circuit, set a discharge time for the one or more capacitors to zero, and change a capacitor test indicator (e.g., a bit) from a logic low to a logic high. At this point, as shown at time $t_1$, the one or more capacitors may begin to discharge. For example, the one or more capacitors may start at an operating voltage associated with NVM power (PWR) 505 and may begin to discharge under a constant current. The host device 110 and/or the capacitor test circuit 380 may wait a time period (e.g., one second), increase the discharge time, and read a counter value. The counter value may be a VDT SMART counter value. The host device 110 and/or the capacitor test circuit 380 may determine whether the VDT SMART counter value has increased. If the VDT SMART counter value has not increased, the host device 110 and/or the capacitor test circuit 380 may continue to perform the capacitor test. For example, the host device 110 and/or the capacitor test circuit 380 may perform another iteration of waiting one second, increasing the discharge time, reading the counter value, and determining if the counter value increased. If the VDT SMART counter value has increased (e.g., based on the voltage of the memory device 120 falling below the voltage threshold VDT1 510, as shown at time 12), the host device 110 may terminate the capacitor test and may output the discharge time 515. The discharge time 515 may be equal to the time period between 1 and 12. In some implementations, there may be more than one voltage threshold. For example, if the voltage of the memory device 120 falls below a second voltage threshold VDT2 520, the memory device may again increase the value of the VDT SMART counter by one. A second discharge time 525 may be equal to the time period between 12 and 13 (or the time period between $t_1$ and $t_3$). As described herein, the host device 110 and/or the capacitor test circuit 380 may perform any number of iterations of the capacitor test until the voltage falls below the voltage threshold and the counter increases by one.

As indicated above, FIG. 5 is provided as an example. Other examples may differ from what is described with regard to FIG. 5.

FIG. 6 is a flowchart of an example method 600 associated with capacitor test. In some implementations, a host device (e.g., the host device 110) may perform or may be configured to perform the method 600. In some implementations, another device or a group of devices separate from or including the host device 110 (e.g., the system 100) may perform or may be configured to perform the method 600. Thus, means for performing the method 600 may include the host device and/or one or more components of the host device. Additionally, or alternatively, a non-transitory computer-readable medium may store one or more instructions that, when executed by the host device (e.g., a controller of the host device 110), cause the memory device to perform the method 600.

As shown in FIG. 6, the method 600 may include initiating a capacitor test for one or more capacitors (block 610). As further shown in FIG. 6, the method 600 may include performing an iteration of the capacitor test for the one or more capacitors, wherein performing the iteration of the capacitor test comprises waiting a time period, increasing a discharge time, reading a counter associated with the capacitor test, and determining whether a value of the counter has increased (block 620). As further shown in FIG. 6, the method 600 may include performing another iteration of the capacitor test or terminating the capacitor test based on determining whether the value of the counter has increased (block 630).

The method 600 may include additional aspects, such as any single aspect or any combination of aspects described below and/or described in connection with one or more other methods or operations described elsewhere herein.

In a first aspect, the method 600 includes performing multiple iterations of the capacitor test until the one or more components determine that the value of the counter has increased.

In a second aspect, alone or in combination with the first aspect, performing another iteration of the capacitor test comprises, based on determining that the value of the counter has not increased, performing another iteration of waiting the time period, increasing the discharge time, reading the counter associated with the capacitor test, and determining whether the value of the counter has increased.

In a third aspect, alone or in combination with one or more of the first and second aspects, terminating the capacitor test comprises, based on determining that the value of the counter has increased, changing a capacitor test indicator from a high state to a low state and generating an output that includes the discharge time.

In a fourth aspect, alone or in combination with one or more of the first through third aspects, the memory device is a ball grid array device.

In a fifth aspect, alone or in combination with one or more of the first through fourth aspects, performing the capacitor test comprises performing the capacitor test for the one or more capacitors while the memory device is connected to the system.

In a sixth aspect, alone or in combination with one or more of the first through fifth aspects, initiating the capacitor test comprises initiating a low power mode for the memory device, setting the discharge time to zero, and changing a capacitor test indicator from a low state to a high state.

In a seventh aspect, alone or in combination with one or more of the first through sixth aspects, waiting the time period comprises waiting one second, and increasing the discharge time comprises increasing the discharge time by one second.

In an eighth aspect, alone or in combination with one or more of the first through seventh aspects, the value of the counter is configured to increase based on a voltage associated with the one or more capacitors falling below a voltage threshold.

In a ninth aspect, alone or in combination with one or more of the first through eighth aspects, the capacitor test is associated with a plurality of voltage thresholds, wherein each voltage threshold of the plurality of voltage thresholds is associated with a power drop for the capacitor test.

In a tenth aspect, alone or in combination with one or more of the first through ninth aspects, reading the counter associated with the capacitor test comprises reading a voltage detector self-monitoring, analysis, and reporting technology counter.

In an eleventh aspect, alone or in combination with one or more of the first through tenth aspects, the capacitor test is performed using an analog-to-digital converter associated with the system or an analog-to-digital converter associated with a system-on-chip device included in the system.

Although FIG. 6 shows example blocks of a method 600, in some implementations, the method 600 may include additional blocks, fewer blocks, different blocks, or differently arranged blocks than those depicted in FIG. 6. Additionally, or alternatively, two or more of the blocks of the method 600 may be performed in parallel. The method 600 is an example of one method that may be performed by one or more devices described herein. These one or more devices may perform or may be configured to perform one or more other methods based on operations described herein.

In some implementations, a system includes a memory device; one or more capacitors located externally to the memory device; and one or more components configured to: initiate a capacitor test for the one or more capacitors; perform an iteration of the capacitor test for the one or more capacitors, wherein performing the iteration of the capacitor test comprises: waiting a time period; increasing a discharge time; reading a counter associated with the capacitor test; and determining whether a value of the counter has increased; and perform another iteration of the capacitor test or terminate the capacitor test based on determining whether the value of the counter has increased.

In some implementations, a system includes a ball-grid array (BGA) device; and one or more components configured to: initiate a capacitor test for one or more capacitors; perform an iteration of the capacitor test for the one or more capacitors, wherein performing the iteration of the capacitor test comprises: waiting a time period; increasing a discharge time; reading a counter associated with the capacitor test; and determining whether a value of the counter has increased; and perform another iteration of the capacitor test or terminate the capacitor test based on determining whether the value of the counter has increased.

In some implementations, a system includes a memory device; and one or more components configured to: initiate a capacitor test for one or more capacitors while the memory device is connected to the system; perform an iteration of the capacitor test for the one or more capacitors, wherein performing the iteration of the capacitor test comprises: waiting a time period; increasing a discharge time; reading a counter associated with the capacitor test; and determining whether a value of the counter has increased; and perform another iteration of the capacitor test or terminate the capacitor test based on determining whether the value of the counter has increased.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A system, comprising:
a memory device;
one or more capacitors located externally to the memory device; and
one or more components configured to:
 initiate a capacitor test for the one or more capacitors;
 perform an iteration of the capacitor test for the one or more capacitors, wherein performing the iteration of the capacitor test comprises:
  waiting a time period;
  increasing a discharge time;
  reading a counter associated with the capacitor test; and
  determining whether a value of the counter has increased; and
 perform another iteration of the capacitor test or terminate the capacitor test based on determining whether the value of the counter has increased.

2. The system of claim 1, wherein the one or more components are configured to perform multiple iterations of the capacitor test until the one or more components determine that the value of the counter has increased.

3. The system of claim 1, wherein the one or more components, to perform another iteration of the capacitor test, and based on determining that the value of the counter has not increased, are configured to perform another iteration of:
 waiting the time period;
 increasing the discharge time;
 reading the counter associated with the capacitor test; and
 determining whether the value of the counter has increased.

4. The system of claim 1, wherein the one or more components, to terminate the capacitor test, and based on determining that the value of the counter has increased, are configured to:

change a capacitor test indicator from a high state to a low state; and
generate an output that includes the discharge time.

5. The system of claim 1, wherein the memory device is a ball grid array device.

6. The system of claim 1, wherein the one or more components, to perform the capacitor test, are configured to perform the capacitor test for the one or more capacitors while the memory device is connected to the system.

7. The system of claim 1, wherein the one or more components, to initiate the capacitor test, are configured to:
 initiate a low power mode for the memory device;
 set the discharge time to zero; and
 change a capacitor test indicator from a low state to a high state.

8. The system of claim 1, wherein the one or more components, to wait the time period, are configured to wait one second, and wherein the one or more components, to increase the discharge time, are configured to increase the discharge time by one second.

9. The system of claim 1, wherein the value of the counter is configured to increase based on a voltage associated with the one or more capacitors falling below a voltage threshold.

10. The system of claim 1, wherein the capacitor test is associated with a plurality of voltage thresholds, wherein each voltage threshold of the plurality of voltage thresholds is associated with a power drop for the capacitor test.

11. The system of claim 1, wherein the one or more components, to read the counter associated with the capacitor test, are configured to read a voltage detector self-monitoring, analysis, and reporting technology counter.

12. The system of claim 1, wherein the capacitor test is performed using an analog-to-digital converter associated with the system or an analog-to-digital converter associated with a system-on-chip device included in the system.

13. A system, comprising:
a ball-grid array (BGA) device; and
one or more components configured to:
 initiate a capacitor test for one or more capacitors;
 perform an iteration of the capacitor test for the one or more capacitors, wherein performing the iteration of the capacitor test comprises:
  waiting a time period;
  increasing a discharge time;
  reading a counter associated with the capacitor test; and
  determining whether a value of the counter has increased; and
 perform another iteration of the capacitor test or terminate the capacitor test based on determining whether the value of the counter has increased.

14. The system of claim 13, wherein the one or more components are configured to perform multiple iterations of the capacitor test until the one or more components determine that the value of the counter has increased.

15. The system of claim 13, wherein the one or more components, to perform another iteration of the capacitor test, and based on determining that the value of the counter has not increased, are configured to perform another iteration of:
 waiting the time period;
 increasing the discharge time;
 reading the counter associated with the capacitor test; and
 determining whether the value of the counter has increased.

16. The system of claim 13, wherein the one or more components, to terminate the capacitor test, and based on determining that the value of the counter has increased, are configured to:

change a capacitor test indicator from a high state to a low state; and generate an output that includes the discharge time.

17. A system, comprising:

a memory device; and one or more components configured to:

initiate a capacitor test for one or more capacitors while the memory device is connected to the system;

perform an iteration of the capacitor test for the one or more capacitors, wherein performing the iteration of the capacitor test comprises:

waiting a time period;

increasing a discharge time;

reading a counter associated with the capacitor test; and determining whether a value of the counter has increased; and perform another iteration of the capacitor test or terminate the capacitor test based on determining whether the value of the counter has increased.

18. The system of claim 17, wherein the one or more components are configured to perform multiple iterations of the capacitor test until the one or more components determine that the value of the counter has increased.

19. The system of claim 17, wherein the one or more components, to perform another iteration of the capacitor test, and based on determining that the value of the counter has not increased, are configured to perform another iteration of:

waiting the time period;

increasing the discharge time;

reading the counter associated with the capacitor test; and determining whether the value of the counter has increased.

20. The system of claim 17, wherein the one or more components, to terminate the capacitor test, and based on determining that the value of the counter has increased, are configured to:

change a capacitor test indicator from a high state to a low state; and generate an output that includes the discharge time.

* * * * *